(12) United States Patent
Anirudhan et al.

(10) Patent No.: US 11,994,557 B2
(45) Date of Patent: May 28, 2024

(54) ADAPTIVE PORT CEILING ASSIGNMENT FOR BACKGROUND I/O OPERATIONS BETWEEN HETEROGENEOUS STORAGE ARRAYS

(71) Applicant: Dell Products, L.P., Hopkinton, MA (US)

(72) Inventors: Ananthakrishnan Anirudhan, Bangalore (IN); Santoshkumar Konnur, Bangalore (IN); Deepak Vokaliga, Hopkinton, MA (US)

(73) Assignee: Dell Products, L.P., Hopkinton, MA (US)

( * ) Notice: Subject to any disclaimer, the term of this patent is extended or adjusted under 35 U.S.C. 154(b) by 45 days.

(21) Appl. No.: 17/943,244

(22) Filed: Sep. 13, 2022

(65) Prior Publication Data

US 2024/0085474 A1 Mar. 14, 2024

(51) Int. Cl.
*G01R 31/317* (2006.01)
*G01R 31/3181* (2006.01)

(52) U.S. Cl.
CPC . *G01R 31/31715* (2013.01); *G01R 31/31725* (2013.01); *G01R 31/31813* (2013.01)

(58) Field of Classification Search
CPC ........ G01R 31/31715; G01R 31/31725; G01R 31/31813
USPC .......................................................... 714/718
See application file for complete search history.

(56) References Cited

U.S. PATENT DOCUMENTS

| | | | | |
|---|---|---|---|---|
| 2004/0015317 A1* | 1/2004 | Klotz | .................... | G06F 11/263 702/123 |
| 2004/0015744 A1* | 1/2004 | Klotz | .................. | G06F 11/3414 714/E11.193 |
| 2011/0138227 A1* | 6/2011 | Lin | ...................... | G11B 5/5582 700/282 |
| 2016/0140001 A1* | 5/2016 | Kulkarni | ............. | G06F 11/3006 714/4.12 |
| 2019/0213104 A1* | 7/2019 | Qadri | .................. | H04L 67/1097 |
| 2021/0326275 A1 | 10/2021 | Anirudhan et al. | | |

* cited by examiner

*Primary Examiner* — James C Kerveros
(74) *Attorney, Agent, or Firm* — Anderson Gorecki LLP

(57) ABSTRACT

A port manager is configured to implement adaptive port ceiling assignment for background Input/Output (I/O) operations between heterogeneous storage arrays. The port manager generates a set of test I/O operations, applies the I/O operations to a port under test, determines a response time to complete the I/O operations on the port under test, and compares the response time of the current test with response times of a set of previous tests. Based on the test values, the port manager identifies a throughput inflection point for the port under test, which is used to set a maximum throughput of the port under test. The adaptive ceiling for the port under test is then set based on the maximum throughput times a ceiling percentage threshold value. The determined adaptive ceiling value is then used to prospectively limit background I/O operations on the port under test.

18 Claims, 7 Drawing Sheets

FIG. 4

| Port ID 400 | Maximum throughput 405 | Background process use Ceiling % 410 | Background process allowed throughput 415 |
|---|---|---|---|
| 0001 | 10G | 20% | 2G |
| 0002 | 12G | 35% | 4.2G |
| ... | ... | ... | ... |
| N-1 | 40G | 15% | 6G |
| N | 100G | 20% | 20G |

Port Data Structure 205

FIG. 5

Port Throughput Test Queue 210

| IO Test ID | Test size (Number of IOs * IO Size) | Response Time |
|---|---|---|
| Test 3 | 10G | 1 time unit |
| Test 4 | 11G | 1 time unit |
| Test 5 | 12G | 1 time unit |
| Test 6 | 13G | 1 time unit |
| Test 7 | 14G | 1 time unit |
| Test 8 | 15G | 1 time unit |
| Test 9 | 16G | 1.1 time unit |
| Test 10 | 17G | 1.2 time unit |

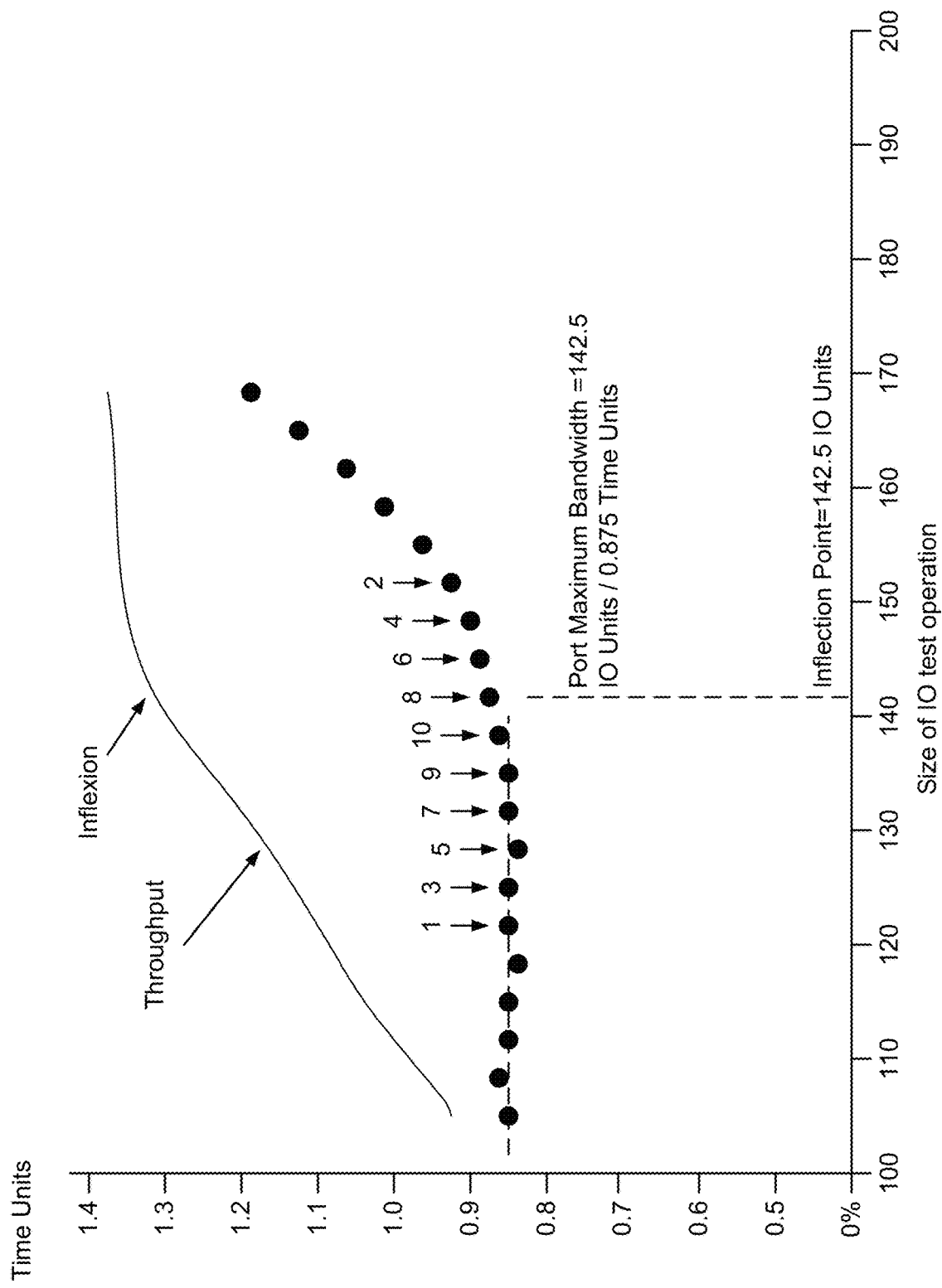

ADAPTIVE PORT CEILING ASSIGNMENT FOR BACKGROUND I/O OPERATIONS BETWEEN HETEROGENEOUS STORAGE ARRAYS

FIELD

This disclosure relates to computing systems and related devices and methods, and, more particularly, to adaptive port ceiling assignment for background I/O operations between heterogeneous storage arrays.

SUMMARY

The following Summary and the Abstract set forth at the end of this document are provided herein to introduce some concepts discussed in the Detailed Description below. The Summary and Abstract sections are not comprehensive and are not intended to delineate the scope of protectable subject matter, which is set forth by the claims presented below.

All examples and features mentioned below can be combined in any technically possible way.

In some embodiments, a port manager is configured to implement adaptive port ceiling assignment for background Input/Output (I/O) operations between heterogeneous storage arrays. The port manager generates a set of test I/O operations, applies the I/O operations to a port under test, determines a response time to complete the I/O operations on the port under test, and compares the response time of the current test with response times of a set of previous tests. Based on the test values, the port manager identifies a throughput inflection point for the port under test, which is used to set a maximum throughput of the port under test. The adaptive ceiling for the port under test is then set based on the maximum throughput times a ceiling percentage threshold value. The determined adaptive ceiling value is then used to prospectively limit background I/O operations on the port under test. In some embodiments, the maximum allowable bandwidth value on the port under test is implemented by enforcing a delay between I/O operations by the background processes, to thus adjust the frequency of background I/O operations on the port under test to prevent starvation of bandwidth on the port under test for use by host I/O operations.

BRIEF DESCRIPTION OF THE DRAWINGS

FIG. 4 is a functional block diagram of an example port data structure maintained by the port manager of FIG. 2, according to some embodiments.

FIG. 5 is a functional block diagram of an example throughput test queue maintained by the port manager to test port speeds of the ports of the storage system of FIG. 2, according to some embodiments.

FIGS. 6 and 7 are graphs showing example changes in port response times vs size of test I/O operations, according to some embodiments.

DETAILED DESCRIPTION

Aspects of the inventive concepts will be described as being implemented in a storage system 100 connected to a host computer 102. Such implementations should not be viewed as limiting. Those of ordinary skill in the art will recognize that there are a wide variety of implementations of the inventive concepts in view of the teachings of the present disclosure.

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory tangible computer-readable medium. Furthermore, it will be understood by those of ordinary skill in the art that the computer-executable instructions may be executed on a variety of tangible processor devices, i.e., physical hardware. For ease of exposition, not every step, device or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g., and without limitation, abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, and/or software implemented by computer instructions that are stored on a non-transitory tangible computer-readable medium and implemented by multi-purpose tangible processors, and any combinations thereof.

Figure 1:
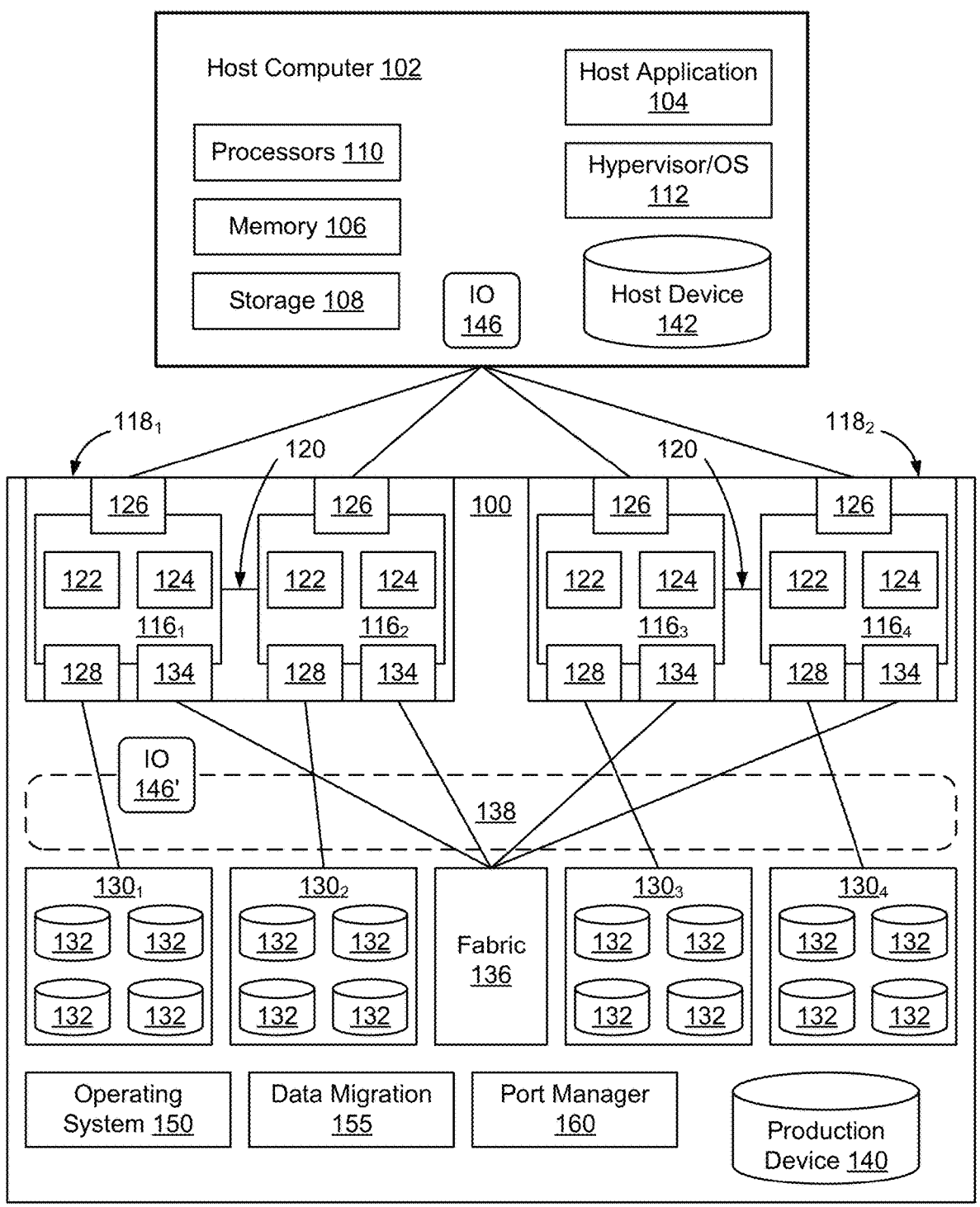
FIG. 1 is a functional block diagram of an example storage system connected to a host computer, according to some embodiments.

FIG. 1 illustrates a storage system 100 and an associated host computer 102, of which there may be many. The storage system 100 provides data storage services for a host application 104, of which there may be more than one instance and type running on the host computer 102. In the illustrated example, the host computer 102 is a server with host volatile memory 106, persistent storage 108, one or more tangible processors 110, and a hypervisor or OS (Operating System) 112. The processors 110 may include one or more multi-core processors that include multiple CPUs (Central Processing Units), GPUs (Graphics Processing Units), and combinations thereof. The host volatile memory 106 may include RAM (Random Access Memory) of any type. The persistent storage 108 may include tangible persistent storage components of one or more technology types, for example and without limitation SSDs (Solid State Drives) and HDDs (Hard Disk Drives) of any type, including but not limited to SCM (Storage Class Memory), EFDs (Enterprise Flash Drives), SATA (Serial Advanced Technology Attachment) drives, and FC (Fibre Channel) drives. The host computer 102 might support multiple virtual hosts running on virtual machines or containers. Although an external host computer 102 is illustrated in FIG. 1, in some embodiments host computer 102 may be implemented as a virtual machine within storage system 100.

The storage system 100 includes a plurality of compute nodes $116_1$-$116_4$, possibly including but not limited to storage servers and specially designed compute engines or storage directors for providing data storage services. In some embodiments, pairs of the compute nodes, e.g. ($116_1$-$116_2$) and ($116_3$-$116_4$), are organized as storage engines $118_1$ and $118_2$, respectively, for purposes of facilitating failover between compute nodes 116 within storage system 100. In some embodiments, the paired compute nodes 116 of each storage engine 118 are directly interconnected by communication links 120. As used herein, the term "storage engine" will refer to a storage engine, such as storage engines $118_1$ and $118_2$, which has a pair of (two independent) compute nodes, e.g. ($116_1$-$116_2$) or ($116_3$-$116_4$). A given storage engine 118 is implemented using a single physical enclosure and provides a logical separation between itself and other storage engines 118 of the storage system 100. A given storage system 100 may include one storage engine 118 or multiple storage engines 118.

Each compute node, $116_1$, $116_2$, $116_3$, $116_4$, includes processors 122 and a local volatile memory 124. The processors 122 may include a plurality of multi-core processors of one or more types, e.g., including multiple CPUs, GPUs, and combinations thereof. The local volatile memory 124 may include, for example and without limitation, any type of RAM. Each compute node 116 may also include one or more front-end adapters 126 for communicating with the host computer 102. Each compute node $116_1$-$116_4$ may also include one or more back-end adapters 128 for communicating with respective associated back-end drive arrays $130_1$-$130_4$, thereby enabling access to managed drives 132. A given storage system 100 may include one back-end drive array 130 or multiple back-end drive arrays 130.

In some embodiments, managed drives 132 are storage resources dedicated to providing data storage to storage system 100 or are shared between a set of storage systems 100. Managed drives 132 may be implemented using numerous types of memory technologies for example and without limitation any of the SSDs and HDDs mentioned above. In some embodiments the managed drives 132 are implemented using NVM (Non-Volatile Memory) media technologies, such as NAND-based flash, or higher-performing SCM (Storage Class Memory) media technologies such as 3D XPoint and ReRAM (Resistive RAM). Managed drives 132 may be directly connected to the compute nodes $116_1$-$116_4$, using a PCIe (Peripheral Component Interconnect Express) bus or may be connected to the compute nodes $116_1$-$116_4$, for example, by an IB (InfiniBand) bus or fabric.

In some embodiments, each compute node 116 also includes one or more channel adapters 134 for communicating with other compute nodes 116 directly or via an interconnecting fabric 136. An example interconnecting fabric 136 may be implemented using InfiniBand. Each compute node 116 may allocate a portion or partition of its respective local volatile memory 124 to a virtual shared "global" memory 138 that can be accessed by other compute nodes 116, e.g., via DMA (Direct Memory Access) or RDMA (Remote Direct Memory Access). Shared global memory 138 will also be referred to herein as the cache of the storage system 100.

The storage system 100 maintains data for the host applications 104 running on the host computer 102. For example, host application 104 may write data of host application 104 to the storage system 100 and read data of host application 104 from the storage system 100 in order to perform various functions. Examples of host applications 104 may include but are not limited to file servers, email servers, block servers, and databases.

Logical storage devices are created and presented to the host application 104 for storage of the host application 104 data. For example, as shown in FIG. 1, a production device 140 and a corresponding host device 142 are created to enable the storage system 100 to provide storage services to the host application 104.

The host device 142 is a local (to host computer 102) representation of the production device 140. Multiple host devices 142, associated with different host computers 102, may be local representations of the same production device 140. The host device 142 and the production device 140 are abstraction layers between the managed drives 132 and the host application 104. From the perspective of the host application 104, the host device 142 is a single data storage device having a set of contiguous fixed-size LBAs (Logical Block Addresses) on which data used by the host application 104 resides and can be stored. However, the data used by the host application 104 and the storage resources available for use by the host application 104 may actually be maintained by the compute nodes $116_1$-$116_4$ at non-contiguous addresses (tracks) on various different managed drives 132 on storage system 100.

In some embodiments, the storage system 100 maintains metadata that indicates, among various things, mappings between the production device 140 and the locations of extents of host application data in the virtual shared global memory 138 and the managed drives 132. In response to an I/O (Input/Output command) 146 from the host application 104 to the host device 142, the hypervisor/OS 112 determines whether the I/O 146 can be serviced by accessing the host volatile memory 106. If that is not possible then the I/O 146 is sent to one of the compute nodes 116 to be serviced by the storage system 100.

In the case where I/O 146 is a read command, the storage system 100 uses metadata to locate the commanded data, e.g., in the virtual shared global memory 138 or on managed drives 132. If the commanded data is not in the virtual shared global memory 138, then the data is temporarily copied into the virtual shared global memory 138 from the managed drives 132 and sent to the host application 104 by the front-end adapter 126 of one of the compute nodes $116_1$-$116_4$. In the case where the I/O 146 is a write command, in some embodiments the storage system 100 copies a block being written into the virtual shared global memory 138, marks the data as dirty, and creates new metadata that maps the address of the data on the production device 140 to a location to which the block is written on the managed drives 132.

Figure 2:
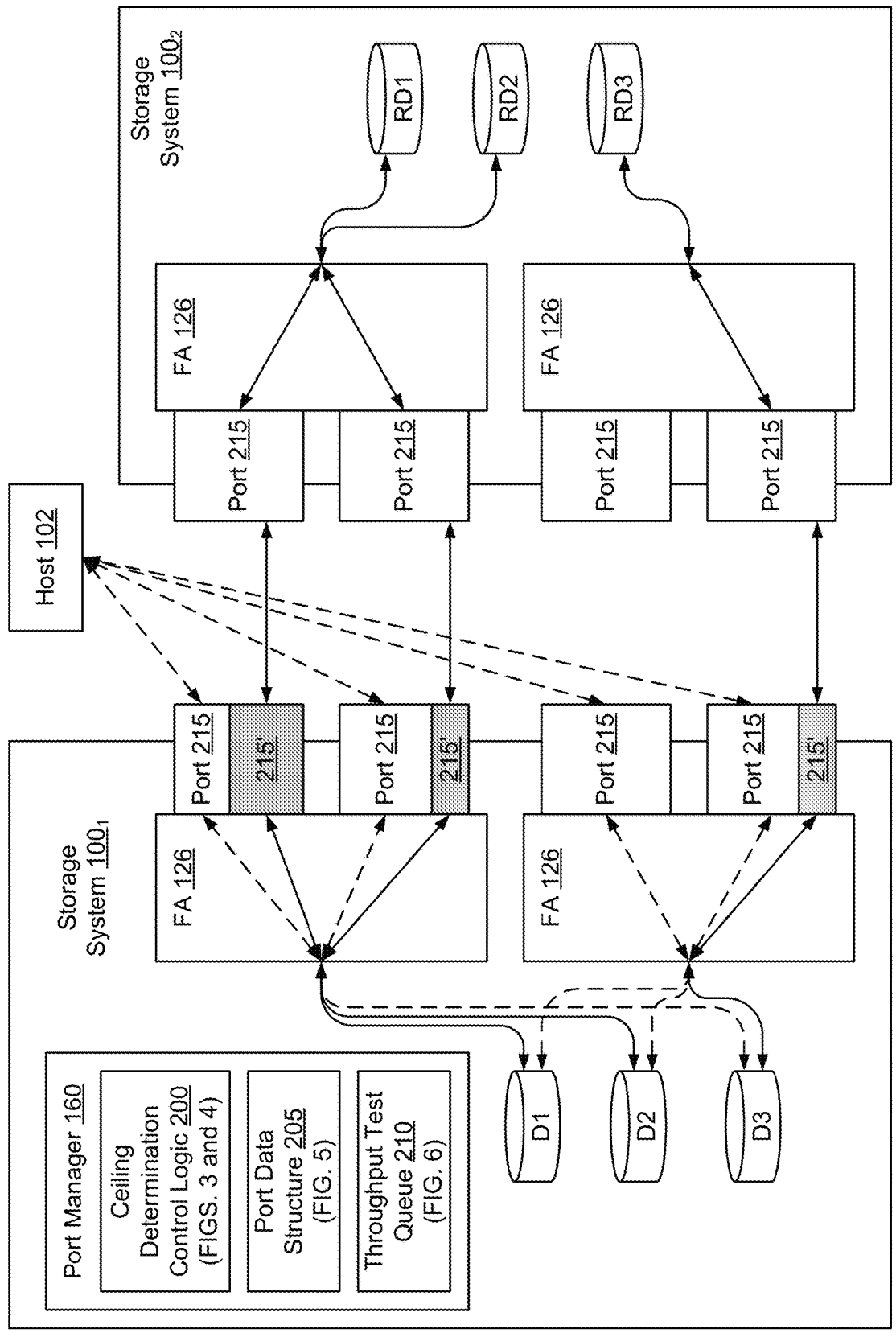
FIG. 2 is a functional block diagram of an example set of heterogeneous storage systems interconnected to enable data backup operations and including a port manager configured to enable adaptive port ceiling assignment for background I/O operations, according to some embodiments.

FIG. 2 is a functional block diagram of an example set of heterogeneous storage systems interconnected to enable data backup operations and including a port manager configured to enable adaptive port ceiling assignment for background I/O operations, according to some embodiments.

As shown in FIG. 2, multiple heterogeneous storage systems $100_1$, $100_2$, may be interconnected to allow for the transfer of data therebetween. The storage systems $100_1$, $100_2$, may be directly connected by links or may be connected via an intervening communication network depending on the deployment. In some cases, connection points on one or more of the storage devices ("ports") are shared between hosts 102 and other storage systems so that, for example, a port 115 of a storage system $100_1$ may have both a host 102 and another storage system 100₂ coupled thereto. Although FIG. 2 shows storage system 100₁ having ports that are used by both hosts and background tasks, it should be understood that storage system 100₂ may be similarly configured.

Background tasks are used to send data from storage system 100₁ to storage system 100₂. Example background tasks may be related to copying or mirroring data from storage system 100₁ to storage system 100₂, although other background tasks associated with data mobility, data migration, and data replication may similarly be implemented to transmit data over ports 215. If a background task related to the interconnection of the storage systems 100₁, 100₂ (e.g., a copy between storage systems) uses too much of the data bandwidth of the port 215, the result may be that input/output (I/O) operations from the host 102 are delayed or otherwise negatively affected. Accordingly, it is desirable to provide a mechanism to manage port accesses by background I/O tasks to ensure that the ports 215 guarantee sufficient bandwidth to accommodate host I/O tasks.

According to some embodiments, a port manager 160 is configured to set a ceiling 215' on the amount of port bandwidth that is allocated to be used by the background I/O tasks related to mobility, migration, and replication. As used herein, the term "ceiling value" is used to refer to a dynamically determined allowable amount of bandwidth of a port that is able to be used by background tasks in connection with copying data between heterogeneous storage systems. By determining and applying a delay amount between background I/O operations (where the delay amount corresponds to the percentage of bandwidth allocated to the subset of background processes), it is possible to ensure that the background I/O operations do not cause host I/O operations to be starved of port resources.

Unfortunately, since port speeds regularly change, for example when the ports of the FA are changed or new port technologies are deployed or developed, using hard coded bandwidth restrictions for background I/O operations doesn't fully optimize use of port bandwidth, and code changes are required to update the new ceiling values any time a port speed changes. According to some embodiments, instead of using a hard coded value for the background I/O ceiling value, a port manager 160 is configured to enable adaptive port ceiling assignment for background I/O operations. In some embodiments, the port manager 160 is configured to enable the maximum available port speed to be determined, and to enable the ceiling code to be automatically adapt based on the new port's speed. Since the port manager is configured to test the port speed to detect changes in available port speeds, the port manager is able to adjust the ceiling applied to background I/O operations automatically. Accordingly, the storage system can enable new ports with different port speeds to be accommodated without required code changes, and enable the migration or any background tasks to use the newly introduced port for I/O operations based on the newly calculated port ceiling values.

According to some embodiments, a port manager is configured to implement adaptive port ceiling assignment for background Input/Output (I/O) operations between heterogeneous storage arrays. The port manager generates a set of test I/O operations, applies the I/O operations to a port under test, determines a response time to complete the I/O operations on the port under test, and compares the response time of the current test with response times of a set of previous tests. Based on the test values, the port manager identifies a throughput inflection point for the port under test, which is used to set a maximum throughput of the port under test. The adaptive ceiling for the port under test is then set based on the maximum throughput times a ceiling percentage threshold value. The determined adaptive ceiling value is then used to prospectively limit background I/O operations on the port under test.

As shown in FIG. 2, in some embodiments the port manager 160 includes ceiling determination control logic 200. An example process implemented by the ceiling determination control logic 200 is described in greater detail in connection with FIG. 3. The port manager 160 also includes a port data structure 205 that is used to maintain information about the set of ports 215 on the storage system. An example port data structure 205 is described in greater detail in connection with FIG. 4. The port manager 160 also includes a throughput test queue 210 that the port manager uses to test port speeds in connection with setting background I/O ceiling values for the ports of the storage system. An example throughput test queue 215 is described in greater detail in connection with FIG. 5.

Figure 3:
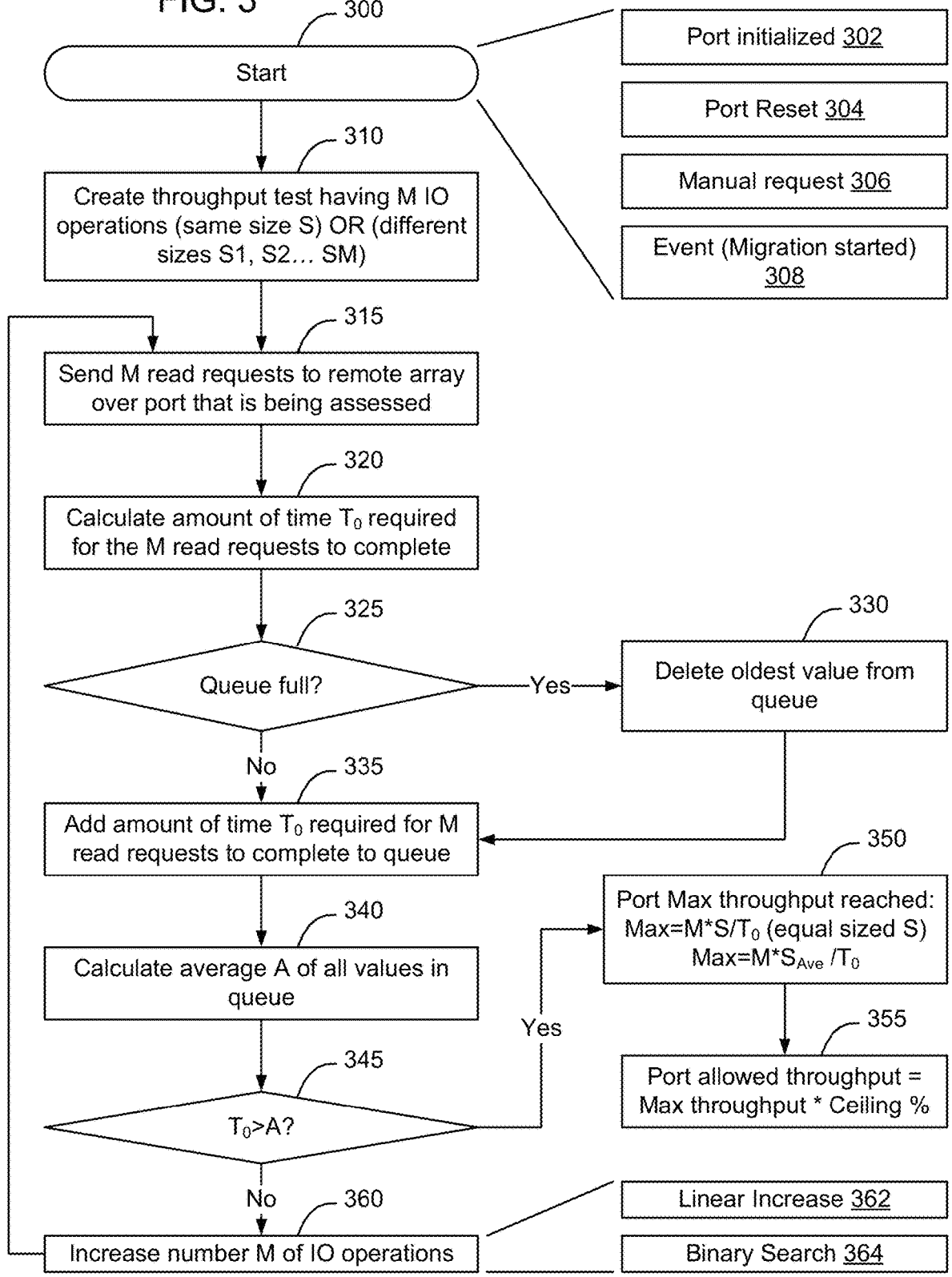
FIG. 3 is a flow chart of an example process configured to implement adaptive port ceiling assignment for background I/O operations on the ports of the storage system of FIG. 2, according to some embodiments.

FIG. 3 is a flow chart of an example process of implementing adaptive port ceiling 215' assignment for background I/O operations on the ports 215 of the storage system of FIG. 2, according to some embodiments. As shown in FIG. 3, in some embodiments the control logic 200 of the port manager 160 is configured to start an adaptive port ceiling assignment for background I/O operations between heterogeneous storage arrays on a particular port (block 300) in connection with a determination that one or more triggering conditions has occurred. As shown in FIG. 3, several example triggering conditions might include a port initialization event (block 302), a port reset event (block 304), a manual reset event (block 306), or a new logical event such as the start of a data migration event (block 308). Other trigger conditions might be similarly be used to cause the control logic initiate an adaptive port ceiling assignment for background I/O operations, depending on the particular implementation.

In some embodiments, once the adaptive port ceiling assignment for background I/O operations has been started, the control logic 200 of the port manager 160 creates a throughput test for the port under test to determine the maximum throughput of the port under test. In some embodiments, as shown in FIG. 3, the initial throughput test is configured to have a certain number M of Input/Output (I/O) operations that will be applied to the port under test (block 310). In some implementations, the I/O operations are read I/O operations, requesting that data be transmitted back to the storage system via the port under test. The I/O operations may be configured to be all of the same size or, alternatively, may be configured to be of different sizes depending on the implementation. When testing the maximum throughput of the port, the number of I/O operations M and the size S of the I/O operations is used to determine the actual bandwidth of the port=M*S, where S is the size of the I/O operation and may be either a fixed size, or based on an average size of the set of M I/O operations.

In some embodiments, the port manager 160 then sends the M read requests to a remote storage system 100₂ over the port under test 215 (block 315). The port manager then calculates the amount of time $T_0$ required for the M read requests to complete (block 320).

In some embodiments, the port manager maintains a port throughput test queue 205 (see FIG. 5) which may be implemented, for example, as a FIFO queue. In embodiments where the port throughput test queue 205 is a FIFO queue, the port manager determines if the port throughput test queue 205 is full (block 325). If the port throughput test queue 205 is full (a determination of YES at block 325), the port manager deletes the oldest value from the port throughput test queue 205 (block 330) and adds the amount of time $T_0$ required for the M read requests to complete to the port throughput test queue 205 (block 335). If the port manager determines that the port throughput test queue 205 is not full (a determination of NO at block 325), the port manager adds the amount of time $T_0$ required for the M read requests to complete to the port throughput test queue 205 (block 335).

In some embodiments, the port manager then calculates an average A of all recent test values in the port throughput test queue 205. Using a FIFO data structure to implement the port throughput test queue 205 enables the average A to be based on a most recent set of test values for a most recent set of tests on the port under test. For example, if the queue contains test results $T_0, T_1, T_2, \ldots T_N$, the average A may be calculated as $A=(T_0+T_1+T_2+\ldots+T_N)/N$. The depth N of the FIFO queue may be set based on the granularity of the test increments, or other factors, depending on the particular implementation.

As shown in FIG. 3, in some embodiments the time $T_0$ it took to complete the most recent test, is then compared with the average A of the test values stored in the port throughput test queue 205 (block 345). In some embodiments, the port manger implements the comparison (block 345) by looking to determine if the time it took to complete the most recent test $T_0$ is greater than the average A. Comparing the time it took to complete the most recent test $T_0$ with the average A of all values in the port throughput test queue 205 enables the port manager to determine if the max throughput value of the port under test has been reached.

For example, if the port manager determines that the time it took to complete the most recent test $T_0$ is the same as or sufficiently close to the average A of all values in the port throughput test queue 205 (a determination of No at block 345), that means that the port speed was not a limiting factor on completing the set of M I/O operations on the port under test. Accordingly, the maximum throughput of the port has not been reached. To determine the maximum throughput of the port, in some embodiments the port manager creates a new test by increasing the number M of I/O operations that will be passed to the port, and returns to block 315 where the new test is applied to the port under test. In some embodiments, the port manager iterates the process shown in blocks 315-345 until the port manager creates a test having M operations that results in a situation where the amount of time it takes to complete the most recent test $T_0$ is higher than the average A of all values in the port throughput test queue 205 (a determination of YES at block 345). While iterating the test process and increasing the number M of tests, the port manager may perform a linear increase in the number M of test I/O operations (block 362), or may perform a binary search (block 364) depending on the implementation.

As shown in FIG. 3, if the time it took to complete the most recent test $T_0$ is higher than the average A of all values in the port throughput test queue 205 (a determination of YES at block 345), in some embodiments the port manager determines that the port speed caused a limitation on the amount of time that it took to complete the M test operations, and accordingly that the port maximum throughput has been reached (block 350). In some embodiments the maximum port throughput=M*S (Port maximum throughput=the number of test operations M*operation size S). The port manager thus calculates a ceiling value for the port under test based on the determined port maximum throughput. In some embodiments, the port allowed throughput value (dynamically determined ceiling value for the port under test) is calculated as the maximum throughput value determined in block 350 times a ceiling percentage value for the port (block 355).

The ceiling percentage value may be a user set value, a default value, or otherwise determined percentage value. For example, the port manager may set a default ceiling percentage value of 20% of available port bandwidth for use by background operations. However, in some embodiments the ceiling percentage values may be user settable values such that a user may opt to increase the ceiling percentage value for particular ports (e.g. to increase the ceiling value for a port, a set of ports, or all ports to 25% or 50%), or to decrease the ceiling values for particular ports (e.g. to decrease the ceiling value for a port, a set of ports, or all ports to 10% or 15%). Other values may be used as well, depending on the implementation.

By automatically determining the port maximum throughput (block 350), and using the port maximum throughput to set a ceiling value that sets an upper boundary on an amount of bandwidth that the background processes can implement on the port, the port manager is able to set ceiling values for the ports without reference to hard coded ceiling values. For example, if a port is initially a 10G port, and the ceiling percentage value is set at 20%, the background process allowable usage value for the port will be calculated by the port manger to be 2G. If the port is replaced with a new 100G port, the port manager will test the throughput of the port to determine its maximum throughput (100G), apply the ceiling percentage value (20%), and dynamically determine that the new background process allowable usage value for the new port is 20G. By enabling the port manager to dynamically set the new background process port ceiling values, it is possible to replace ports without requiring new hard-coded ceiling values to be established for the ports, thus simplifying configuration of the storage system in connection with modifications to the hardware/software used to implement the input/output interfaces of the storage system.

In some embodiments, the port manager stores the port ceiling values in a port data structure 205 (see FIG. 4). For example, in some embodiments the port data structure includes the port ID 400, a most recently calculated maximum throughput value for the port 405, a ceiling percentage value for the port 410 which, as discussed above, may be a default value or user set value, and a ceiling value (background process allowable usage value 415) for the port 215, which is based on the most recently calculated maximum throughput value 405 and the ceiling percentage value 410.

Figure 6:
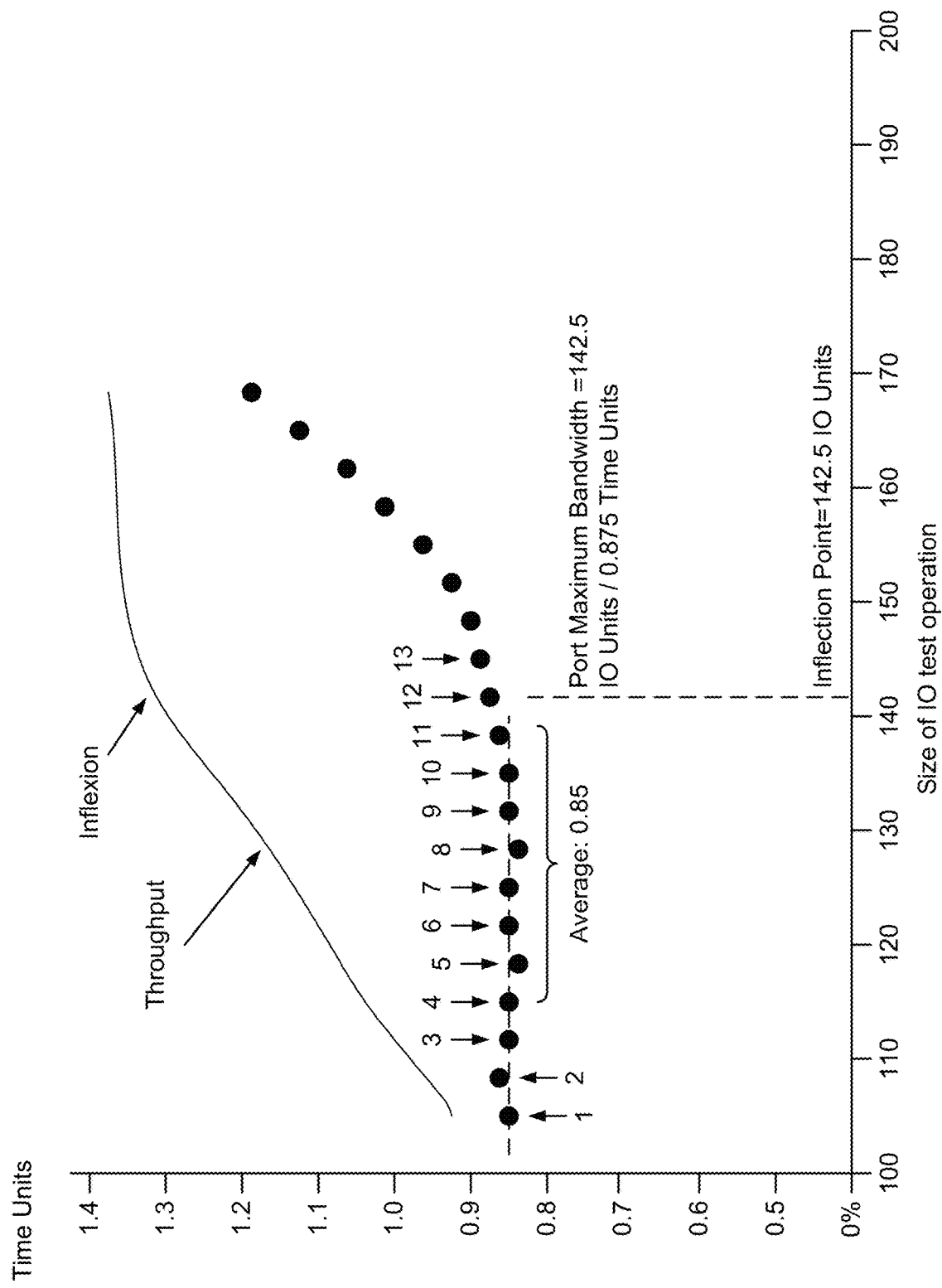

FIGS. 6 and 7 are graphs showing example changes in the amount of time required by a port to implement a set of I/O operations, vs the size of the test I/O operations, according to some embodiments. In particular, FIG. 6 shows an example variation of test response times in which the port manager is configured to look for a throughput inflexion point using a linear search methodology (using a linear test size increment per block 362), and FIG. 7 shows an example variation of test response times in which the port manager is configured to look for a throughput inflexion point using a binary search methodology (using a binary test size increment algorithm per block 364).

In both FIGS. 6 and 7, the port manager uses the port throughput testing to send a set of M read I/O operations having size S to a storage system $100_2$ over the port under test, and then determine the amount of time it takes to receive the requested data from the storage system $100_2$. As shown in FIGS. 6 and 7, during an initial portion, where the port under test has not reached a maximum throughput value, increasing the number of I/O operations will not significantly change the amount of time it takes to complete the I/O operations on the port under test (dashed line in FIGS. 6 and 7). Accordingly, as shown in FIGS. 6 and 7, the determined throughput of the port under test (solid line in FIGS. 6 and 7) is steadily increasing with increasing M value. However, when the number of M test I/O operations reaches a particular value, the throughput of the port under test will reach an inflection point as the throughput of the port under test approach the port's maximum throughput value.

When the size of the tests is increased in a linear manner, as shown in FIG. 6, the throughput inflection point can be determined by comparing the time it takes to complete the current test with an average of the amount of time it took to complete a previous set of tests. For example, in FIG. 6, tests 12 and 13 required more time than the average of tests 1-11 and, as such, indicate that the throughput for the port under test has reached an inflection point. When the amount of time it took to complete the most recent test is larger than the average of a previous set of tests, the inflection point has been reached. In some embodiments, this is interpreted as indicative of the maximum possible throughput for the port under test.

As shown in FIG. 7, it is also possible to conduct a binary search around a suspected throughput inflection point, to determine a maximum throughput value for the port under test. Rather than using a single average, however, in a binary search additional processing may be required, for example by comparing the current test time T0 with both a first average of tests having lower test volumes, and to a second average of tests having higher test volumes. For example, in FIG. 8, if the current test is test 10, a comparison could be made between T0 (test 10), and an average of Tests 1, 3, 5, 7, and 9, and also by comparing T0 (test 10) with the average of Tests 2, 4, 6, and 8. Other ways of determining the throughput inflection point based on test times may be used as well, depending on the implementation. Using a binary search can have a benefit of faster convergence on a determination of the throughput inflection point, depending on the implementation.

In some embodiments, the port manager calculates a delay value for background I/O operations on a port by determining the maximum throughput for the port, multiplying the maximum throughput for the port with the ceiling percentage value. The port manager can then set the delay value based on the size of the I/O operations issued by the background operations on the port, to ensure that the background operations utilize only the maximum allowable port bandwidth.

The methods described herein may be implemented as software configured to be executed in control logic such as contained in a CPU (Central Processing Unit) or GPU (Graphics Processing Unit) of an electronic device such as a computer. In particular, the functions described herein may be implemented as sets of program instructions stored on a non-transitory tangible computer readable storage medium. The program instructions may be implemented utilizing programming techniques known to those of ordinary skill in the art. Program instructions may be stored in a computer readable memory within the computer or loaded onto the computer and executed on computer's microprocessor. However, it will be apparent to a skilled artisan that all logic described herein can be embodied using discrete components, integrated circuitry, programmable logic used in conjunction with a programmable logic device such as a FPGA (Field Programmable Gate Array) or microprocessor, or any other device including any combination thereof. Programmable logic can be fixed temporarily or permanently in a tangible non-transitory computer readable medium such as random-access memory, a computer memory, a disk drive, or other storage medium. All such embodiments are intended to fall within the scope of the present invention.

Throughout the entirety of the present disclosure, use of the articles "a" or "an" to modify a noun may be understood to be used for convenience and to include one, or more than one of the modified noun, unless otherwise specifically stated. The term "about" is used to indicate that a value includes the standard level of error for the device or method being employed to determine the value. The use of the term "or" in the claims is used to mean "and/or" unless explicitly indicated to refer to alternatives only or the alternatives are mutually exclusive, although the disclosure supports a definition that refers to only alternatives and to "and/or." The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and also covers other unlisted steps.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of implementing adaptive port ceiling assignment for limiting background Input/Output (I/O) operations between heterogeneous storage arrays on a port used to implement both host IO operations and the background IO operations between the heterogeneous storage arrays, comprising:

generating a set of M test I/O operations;

applying the M test I/O operations to the port;

determining a response time to complete the M test I/O operations on the port;

comparing the response time to complete the M test I/O operations on the port with a previous set of response times associated with completion of different numbers of test I/O operations on the port;

using the result of the comparison of the response time to complete the M test I/O operations on the port with a previous set of response times associated with completion of the different number of test I/O operations on the port to determine a throughput inflection point for the port;

setting a maximum throughput of the port based on the determined throughput inflection point;

multiplying the maximum throughput of the port with a ceiling percentage threshold value associated with the port to assign an adaptive port ceiling for the port; and prospectively using the assigned adaptive port ceiling to limit the background IO operations implemented on the port between the heterogeneous storage arrays.

2. The method of claim 1, wherein comparing the response time to complete the M test I/O operations on the port with the previous set of response times associated with completion of the different numbers of test I/O operations on the port comprises:
   adding the response time to complete the M test I/O operations on the port to a data structure, the data structure also including the previous set of response times associated with completion of the different numbers of test I/O operations on the port;
   determining an average value of the response times contained in the data structure; and
   comparing the response time to complete the M test I/O operations on the port with the average value of the response times.

3. The method of claim 2, further comprising determining the throughput inflection point for the port when the response time to complete the M test I/O operations on the port is higher than the average value of the response times.

4. The method of claim 1, wherein each of the M test I/O operations has a fixed size.

5. The method of claim 1, wherein at least some of the M test I/O operations have different sizes.

6. The method of claim 4, wherein setting a maximum throughput of the port is based on the number of test I/O operations times the size of the I/O operations.

7. The method of claim 1, wherein the M test I/O operations are read I/O operations directed at one of the heterogeneous storage arrays requesting that data be transmitted from the one of the heterogenous storage arrays back via the port.

8. The method of claim 1, wherein prospectively using the assigned adaptive port ceiling to limit background I/O operations on the port comprises determining a delay value to be applied between successive subsequent background I/O operations on the port.

9. The method of claim 8, wherein the delay value is based on the size of the background I/O operations.

10. A non-transitory tangible computer readable storage medium having stored thereon a computer program for implementing adaptive port ceiling assignment for limiting background Input/Output (I/O) operations between heterogeneous storage arrays on a port used to implement both host IO operations and the background IO operations between the heterogeneous storage arrays, the computer program including a set of instructions which, when executed by a computer, cause the computer to perform a method comprising the steps of:
   generating a set of M test I/O operations;
   applying the M test I/O operations to the port a port;
   determining a response time to complete the M test I/O operations on the port;
   comparing the response time to complete the M test I/O operations on the port with a previous set of response times associated with completion of different numbers of test I/O operations on the port;
   using the result of the comparison of the response time to complete the M test I/O operations on the port with a previous set of response times associated with completion of the different number of test I/O operations on the port to determine a throughput inflection point for the port;
   setting a maximum throughput of the port based on the determined throughput inflection point;
   multiplying the maximum throughput of the port with a ceiling percentage threshold value associated with the port to assign an adaptive port ceiling for the port; and
   prospectively using the assigned adaptive port ceiling to limit the background IO operations implemented on the port between the heterogeneous storage arrays.

11. The non-transitory tangible computer readable storage medium of claim 10, wherein comparing the response time to complete the M test I/O operations on the port with the previous set of response times associated with completion of the different numbers of test I/O operations on the port comprises:
   adding the response time to complete the M test I/O operations on the port to a data structure, the data structure also including the previous set of response times associated with completion of the different numbers of test I/O operations on the port;
   determining an average value of the response times contained in the data structure; and
   comparing the response time to complete the M test I/O operations on the port with the average value of the response times.

12. The non-transitory tangible computer readable storage medium of claim 10, further comprising determining the throughput inflection point for the port when the response time to complete the M test I/O operations on the port is higher than the average value of the response times.

13. The non-transitory tangible computer readable storage medium of claim 10, wherein each of the M test I/O operations has a fixed size.

14. The non-transitory tangible computer readable storage medium of claim 10, wherein at least some of the M test I/O operations have different sizes.

15. The non-transitory tangible computer readable storage medium of claim 10, wherein setting a maximum throughput of the port is based on the number of test I/O operations times the size of the I/O operations.

16. The non-transitory tangible computer readable storage medium of claim 10, wherein the M test I/O operations are read I/O operations directed at one of the heterogeneous storage arrays requesting that data be transmitted from the one of the heterogenous storage arrays back via the port.

17. The non-transitory tangible computer readable storage medium of claim 10, wherein prospectively using the assigned adaptive port ceiling to limit background I/O operations on the port Currently Amended comprises determining a delay value to be applied between successive subsequent background I/O operations on the port.

18. The non-transitory tangible computer readable storage medium of claim 17, wherein the delay value is based on the size of the background I/O operations.

* * * * *